United States Patent [19]

Hukuba

[11] Patent Number: 5,003,250
[45] Date of Patent: Mar. 26, 1991

[54] VOLTAGE TESTING DEVICE FOR ELECTRIC TOOTH-BRUSH

[76] Inventor: Hiroshi Hukuba, No. 914-1, Nazukari, Nagareyama-shi, Chiba-ken, Japan

[21] Appl. No.: 230,318

[22] Filed: Aug. 9, 1988

Related U.S. Application Data

[63] Continuation of Ser. No. 873,226, Jun. 11, 1986, abandoned.

[30] Foreign Application Priority Data

Jun. 17, 1985 [JP] Japan ................................ 60-131454
Sep. 17, 1985 [JP] Japan ................................ 60-204892

[51] Int. Cl.$^5$ ............................................. G01R 19/00
[52] U.S. Cl. ................................... 324/133; 324/437; 320/48
[58] Field of Search ...................... 324/72.5, 133, 426, 324/435, 437; 340/636; 320/48

[56] References Cited

U.S. PATENT DOCUMENTS

| 3,657,648 | 4/1972 | Malme | 324/133 X |
| 3,667,454 | 6/1972 | Prince | 128/24.2 |
| 3,753,095 | 8/1973 | Nichols | 324/437 |
| 4,025,850 | 5/1977 | Spiteri | 324/133 |
| 4,514,695 | 4/1985 | Lau | 324/437 |
| 4,533,864 | 8/1985 | Austin | 324/133 |
| 4,564,802 | 1/1986 | Collins | 324/133 |

FOREIGN PATENT DOCUMENTS

| 0105505 | 4/1984 | European Pat. Off. |
| 39-25815 | 7/1964 | Japan |
| 39-25816 | 7/1964 | Japan |
| 4110098 | 5/1968 | Japan |
| 2098745 | 11/1982 | United Kingdom |
| 2124787 | 2/1984 | United Kingdom |

Primary Examiner—Kenneth Wieder
Assistant Examiner—Jack B. Harvey
Attorney, Agent, or Firm—Flynn, Thiel, Boutell & Tanis

[57] ABSTRACT

A voltage testing device for electric tooth-brushes comprises a device body, a light emitting member mounted to the device body, and a pair of electrical conductors mounted to the device body and having each one end connected to the light emitting member and the other end projecting outwardly of the device body.

2 Claims, 4 Drawing Sheets

VOLTAGE TESTING DEVICE FOR ELECTRIC TOOTH-BRUSH

This application is a continuation of U.S. Ser. No. 873,226, filed June 11, 1986, now abandoned.

BACKGROUND OF THE INVENTION

This invention relates to a voltage testing device for use with an electric tooth-brush having an electric potential generating means.

This type of tooth-brush has been disclosed in U.S. patent application Ser. No. 06/762,976 filed on Aug. 6, 1985 by the present applicant and will be briefly described herein with reference to FIGS. 1 and 2.

In these figures, an electric tooth-brush 21 has a handle 22 including a grip portion 23 in which a battery 24 is accommodated. An electrically conductive bar 25 is embedded in the handle 22, having one end being in contact with a negative pole of the battery 24 and the other end reaching brush bristles 26. Adjacent the brush bristles 26, slots 27 and 28 are formed in top and bottom surfaces of the handle 22, respectively. An electrically conductive cover plate 29 wrapping the grip portion 23 is in contact with a positive pole of the battery 24. A collar 30 is provided for blocking saliva flowing out of the brush bristles which would otherwise reach fingers grasping the grip portion.

During tooth brushing with the tooth-brush 21, the positive pole of the battery 24 electrically conducts to the user's hand through the cover plate 29 and the negative pole to the oral cavity through the electrically conductive bar 25 and saliva in the slot 28, thereby establishing a closed circuit. When a toothpaste containing fluoride is used, this closed circuit causes electrical permeation of fluorine ions into the teeth, thereby ensuring protection and prevention against tooth decay and pyorrhea.

Obviously, the potential of the battery 24 used in the aforementioned electric tooth-brush will decrease as days go by and eventually, the battery will lose requisite energy. Therefore, an instrumental member for measurement of potential of the battery 24 has hitherto been proposed, by means of which an ammeter is provided directly on or in the handle or an indication lamp is attached thereto, and the instrumental member disadvantageously becomes a complicated structure which is disposed of upon disposal of a tooth-brush even if the measuring member is still usable. Inevitably, this tooth-brush with the instrumental member becomes expensive.

SUMMARY OF THE INVENTION

This invention intends to eliminate the drawbacks of the conventional voltage measuring member and has for its object to provide an easy-to-operate and inexpensive independent voltage testing device which is prepared separately from a tooth-brush to avoid complexity of tooth-brush structure.

According to this invention, the above object can be accomplished by a voltage testing device comprising a device body, a light emitting member mounted to the device body, and a pair of electrical conductors mounted to the device body and having one end of each connected to the light emitting member and the other end of each projecting outwardly of the device body. Thus, when the projecting end of one electrical conductor is brought into electrical connection with the positive pole of the battery through the cover plate and the projecting end of the other electrical conductor is brought into electrical connection with the negative pole of the battery through the electrically conductive bar, the light emitter is lighted or flashed if the voltage of the battery is sufficiently high for use but if not so, it remains unlighted, thereby indicating whether the battery or the tooth-brush is usable or not.

Another object of this invention is to provide a testing device which can be operated by the user who is simply devoting slight care to correct measurement of voltage of the battery.

This object can be accomplished by an embodiment of this invention wherein the device body is applied with a mark indicating which one of the positive and negative poles at least one electrical conductor should correspond to. Especially where the mark is pictorial, the correspondence can be discerned easily and clearly.

DESCRIPTION OF THE PREFERRED EMBODIMENTS

Figure 1:
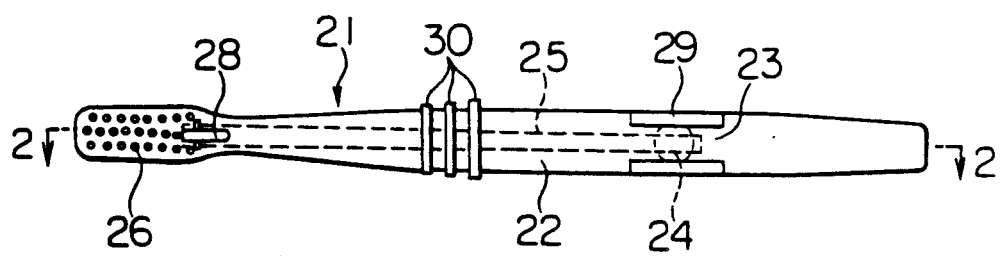
FIG. 1 is a plan view showing an electric tooth-brush accommodating a battery to be measured by a testing device according to the invention.
Figure 2:
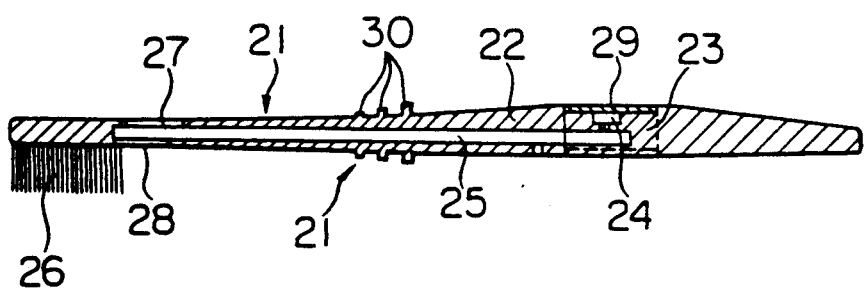
FIG. 2 is a longitudinal sectional view taken on the line 2—2 of FIG. 1 and as viewed in the direction of the arrows.
Figure 3:
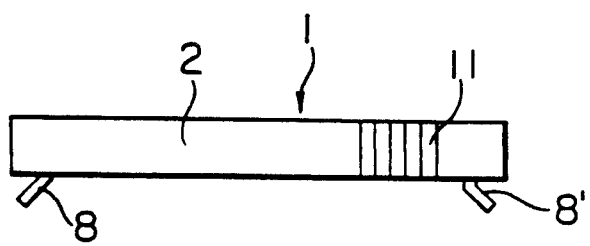
FIG. 3 is a front view of a voltage testing device according to a first embodiment of the invention.
Figure 4:
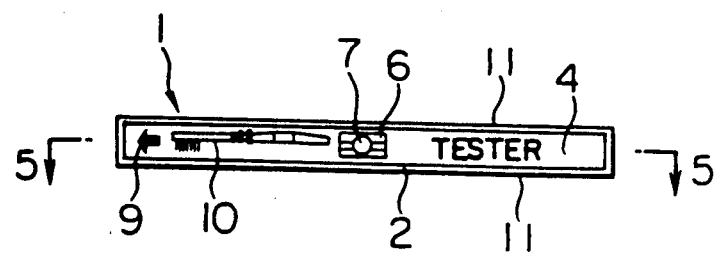
FIG. 4 is a plan view of the FIG. 3 embodiment.
Figure 5:
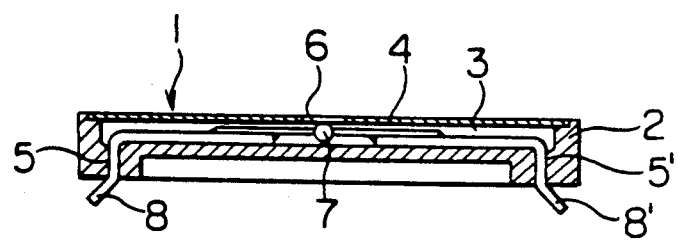
FIG. 5 is a longitudinal sectional view taken on the line 5—5 of FIG. 4 and as viewed in the direction of the arrows.

Referring now to FIGS. 3 to 5, a voltage testing device according to a first embodiment of this invention has an elongated device body 1 which is comprised of a casing 2 formed, in its top surface, with a recess 3 and a cover 4 placed to cover the recess 3. Near axially opposite ends of the recess, holes 5 and 5' are formed in the bottom wall of the recess and an opening 6 is formed in the cover 4 substantially in the middle thereof.

A light emitting member 7 such as a light emitting diode is supported so as to underlie the opening 6 within the recess 3. Thus, opposite leads of the light emitter 7 are connected with electrical wire conductors 8 and 8' which extend through the holes 5 and 5' to project outwardly of the casing 2, terminating in projections which are bent about 45° longitudinally outwardly for fixing the electrical conductors 8 and 8'. The electrical conductors 8 and 8' are respectively brought into electrical connection to the negative and positive poles of the battery 24 of the tooth-brush 21, in a manner to be described later.

A mark, including an arrow 9 and a picture 10 of tooth-brush, is applied or indicated on the top surface of the cover 4, and opposite side surfaces of the casing 2 are corrugated at 11 near the electrical conductor 8'.

Figure 6:
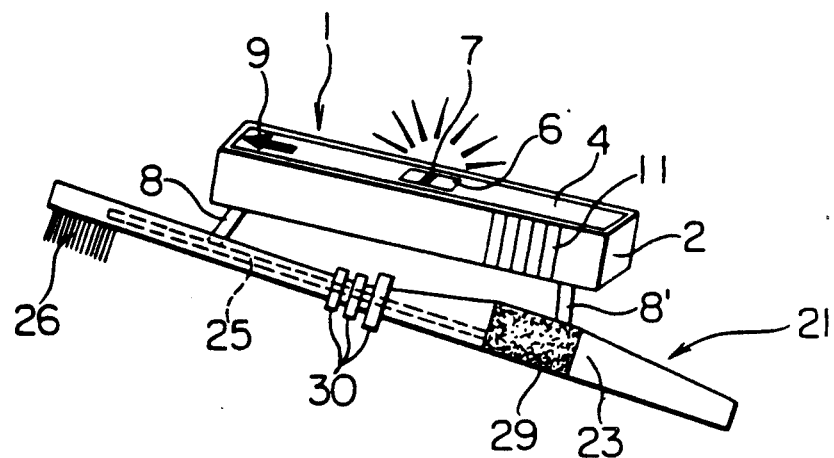
FIG. 6 is a perspective view showing the voltage testing device of the first embodiment when placed in condition for measurement of the voltage of the battery incorporated in the tooth-brush.

As shown in FIG. 6, the voltage testing device constructed as above is applied to the electrical tooth-brush 21 in order to measure the voltage of the battery 24 incorporated therein. More particularly, for measurement of the voltage, the testing device body 1 is carried by hand and the electrical conductor 8 is inserted into the slot 27 in the tooth-brush 21 so as to be brought into engagement with the electrically conductive bar 25 while the electrical conductor 8' being brought into engagement with the cover plate 29 of the tooth-brush 21. Then, if the voltage of the battery 24 is still above a predetermined level, the light emitting member 7 will be lighted but if not so, it remains unlighted, thus making it possible to discern wheather the battery 24 is usable or not.

When using the voltage testing device for measurement of the voltage in the manner as described above, the arrow 9 and picture 10 as well as corrugations 11 aid the user to correctly put the electrical conductors 8 and 8' into electrical connection with the intended poles, that is, the negative and positive poles, respectively. Specifically, by orienting the voltage testing device in accordance with the indication by the pictorial mark 10 of tooth-brush and the arrow 9 in the same direction as the tooth-brush 21, the electrical wire conductor 8 can rest, in a so-called automatic fashion, on the electrically conductive bar 25 in contact with the negative pole and the opposing electrical wire conductor 8' can similarly rest on the cover plate 29 in contact with the positive pole. More conveniently, the user may be experienced in knowing that the corrugations 11 are provided on the side of the electrical conductor 8', so that the same posture as above can also be obtained in a so-called automatic fashion by simply putting into engagement with the cover plate 29 the electrical conductor 8' near the corrugations 11 felt by fingers without asking the user to pay attention to the arrow 9 and picture 10.

Figure 7:
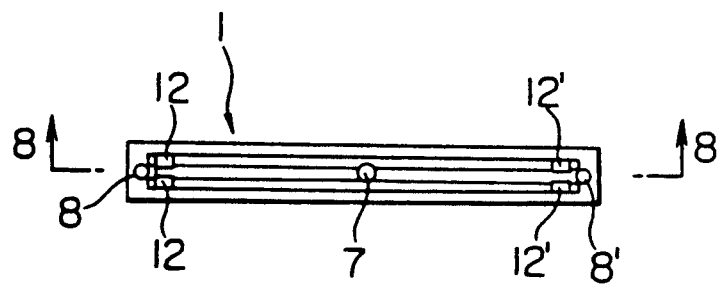
FIG. 7 is a bottom view of a voltage testing device according to a second embodiment of the invention.
Figure 8:
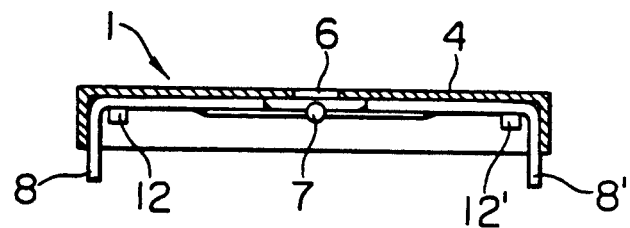
FIG. 8 is a longitudinal sectional view taken on the line 8—8 of FIG. 7 and as viewed in the direction of the arrows.

Turning to FIGS. 7 and 8, there is shown a second embodiment of this invention which is identical to the first embodiment with the exception that the casing 2 of the first embodiment is eliminated and instead the peripheral edge of a cover 4 is elongated downwardly, and that electrical conductors 8 and 8' are carried on a pair of opposing fixtures 12 and 12' depending from the back of the top surface of the cover 4. The testing device of the second embodiment may be used in quite the same way as the first embodiment.

Figure 9:
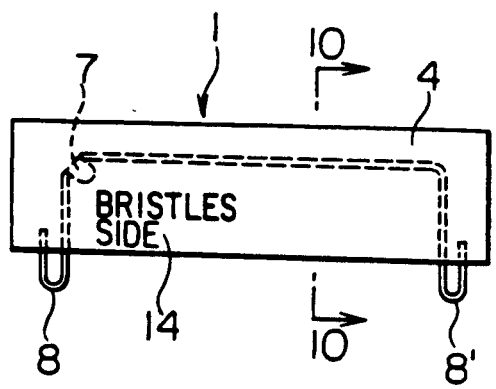
FIG. 9 is a front view of a voltage testing device according to a third embodiment of the invention.
Figure 10:
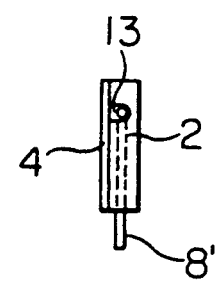
FIG. 10 is a cross-sectional view taken on the line 10—10 of FIG. 9 and as viewed in the direction of the arrows.

In a third embodiment of this invention as shown in FIGS. 9 and 10, a light emitter 7 and electrical wire conductors 8 and 8' are received in a recess 13 patterned in a casing block 2 and a transparent cover 4 is placed to cover the casing 2. A mark 14 in the form of a character reading "bristles side" is applied or indicated on the cover 4. Again, the testing device of the third embodiment may be used in quite the same way as the first embodiment.

Figure 11:
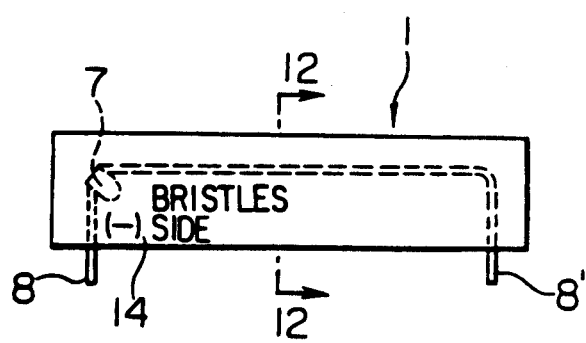
FIG. 11 is a front view of a voltage testing device according to a fourth embodiment of the invention.
Figure 12:
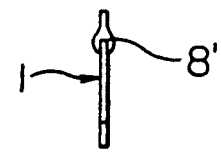
FIG. 12 is a cross-sectional view taken on the line 12—12 of FIG. 11 and as viewed in the direction of the arrows.

In a fourth embodiment of this invention as shown in FIGS. 11 and 12, a device body 1 is formed of two cartons, which are bonded together after a light emitter 7 and electrical conductors 8 and 8' are sandwiched therebetween. As a mark 14, a symbol (−) is applied in addition to the same character as that of the third embodiment. Conveniently, the electrical conductors 8 and 8' of this embodiment may be of printed wiring.

Figure 13:
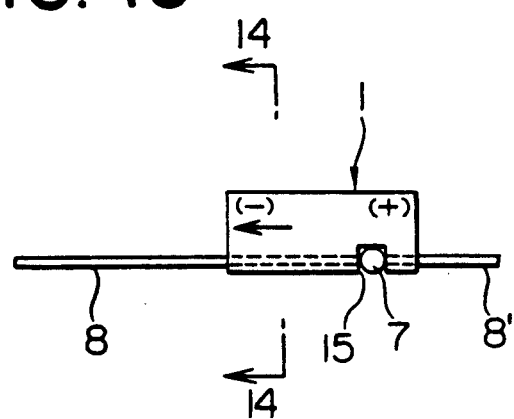
FIG. 13 is a front view showing a voltage testing device according to a fifth embodiment of the invention.
Figure 14:
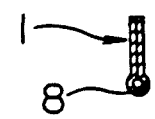
FIG. 14 is a cross-sectional view taken on the line 14—14 of FIG. 3 and as viewed in the direction of the arrows.

A fifth embodiment of this invention as shown in FIGS. 13 and 14 resembles the fourth embodiment but a light emitter 7 of the fifth embodiment is exposed to the outside through an opening 15 formed in a device body 1, so that activation or inactivation of the light emitter 7 can visually be observed more clearly. Used as a mark are symbols (−) and (+) and an arrow. This embodiment may also be used in quite the same manner as the first embodiment.

Figure 15:
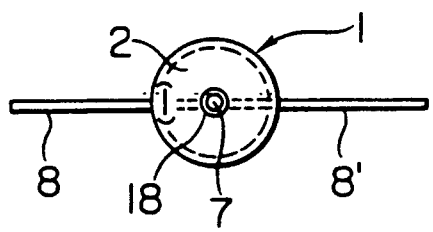
FIG. 15 is a plan view showing a voltage testing device according to a sixth embodiment of the invention.
Figure 16:
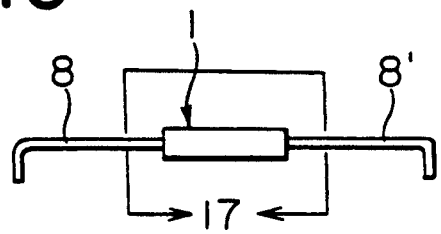
FIG. 16 is a side view of FIG. 15.
Figure 17:
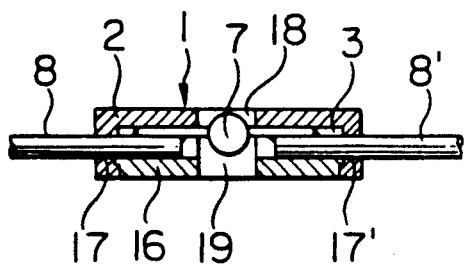
FIG. 17 is an enlarged longitudinal sectional view of a portion in FIG. 16 indicated by an arrow-headed line 17.

A sixth embodiment of this embodiment as shown in FIGS. 15 to 17 has a device body 1 including a casing 2 formed, in its bottom surface, with a recess 3 and a bottom plate 16 snugly fitted, preferably, snapped in the recess 3. Electrical conductors 8 and 8' extend to the outside through holes 17 and 17' formed in opposite side walls of the casing 2, and a light emitter 7 can visually be observed through either an opening 18 in the casing 2 or an opening 19 in the bottom plate 16. Again, the sixth embodiment may be operated in quite the same way as the first embodiment.

Although particular preferred embodiments of the invention have been disclosed in detail for illustrative purposes, it will be recognized that variations or modifications of the disclosed apparatus, including the rearrangement of parts, lie within the scope of the present invention.

What is claimed is:

1. A combination of a tooth-brush containing a battery and a voltage tester for testing the condition of the battery, said tooth-brush comprising an elongated rigid handle having a grip portion at one end thereof and a bristle-studded head portion at the other end thereof; a battery disposed in the interior of said grip portion; an electrically conductive member mounted on the exterior of said grip portion and being electrically connected to one pole of said battery; an electrically conductive bar disposed in the interior of said handle and extending lengthwise thereof from adjacent said battery to adjacent said bristles, one end of said bar being electrically connected to the other pole of said battery, a portion of said bar being exposed to the exterior of said head portion; said voltage tester comprising an elongated rigid voltage tester body positionable adjacent to said tooth-brush and extendable lengthwise thereof between said electrically conductive member and said exposed portion of said bar, said body being substantially rectangular and comprised of a casing having an elongated recess which is open at its upper side, a cover covering the upper side of said recess, said cover having an opening therethrough substantially at the longitudinal middle thereof, said casing having two holes located close to the opposite longitudinal ends of said casing and extending from said recess through the bottom of said casing, a light emitting member mounted inside said body and being visible from outside said body, said light emitting member being disposed in said recess under said opening; a pair of electrical conductors mounted on said body and extending in opposite directions away from said light emitting member, said conductors having exposed, longitudinally spaced-apart, substantially rigid, outer ends projecting outwardly from said body close to the opposite longitudinal ends thereof and being disposed at locations corresponding to the locations of said electrically conductive member and said exposed portion of said bar so that said substantially rigid outer ends can simultaneously touch said electrically conductive member and said exposed portion of said bar, said conductors having inner ends connected to said light emitting member, said conductors being disposed in said recess and extending through said holes with the outer ends of said conductors being bent to diverge in a direction away from said body, and indicating means on said body for indicating the direction in which said body should be placed relative to said tooth-brush for testing said battery of said tooth-brush; whereby when said outer ends of said conductors touch said electrically conductive member and said exposed portion of said bar, the emission of light by said light emitting member is determined by the condition of the battery, said indicating means being provided on said cover and comprising a representation of an arrow and either a picture of a tooth-brush or characters identifying a part of the tooth-brush.

2. A combination of a tooth-brush containing a battery and a voltage tester for testing the condition of the battery, said tooth-brush comprising an elongated rigid handle having a grip portion at one end thereof and a bristle-studded head portion at the other end thereof; a battery disposed in the interior of said grip portion; an electrically conductive member mounted on the exterior of said grip portion and being electrically connected to one pole of said battery; an electrically conductive bar disposed in the interior of said handle and extending lengthwise thereof from adjacent said battery to adjacent said bristles, one end of said bar being electrically connected to the other pole of said battery, a portion of said bar being exposed to the exterior of said head portion; said voltage tester comprising an elongated rigid voltage tester body positionable adjacent to said tooth-brush and extendable lengthwise thereof between said electrically conductive member and said exposed portion of said bar, said body being substantially rectangular and comprised of a cover having a base wall and side and end walls extending downwardly from said base wall and defining an elongated recess which is open at its bottom, said base wall having an opening therethrough substantially at the longitudinal middle thereof, a light emitting member mounted inside said body and being visible from outside said body, said light emitting member being disposed in said recess under said opening; a pair of electrical conductors mounted on said body and extending in opposite directions away from said light emitting member, said conductors having exposed, longitudinally spaced-apart, substantially rigid, outer ends projecting outwardly from said body close to the opposite longitudinal ends thereof and being disposed at locations corresponding to the locations of said electrically conductive member and said exposed portion of said bar so that said substantially rigid outer ends can simultaneously touch said electrically conductive member and said exposed portion of said bar, said conductors having inner ends connected to said light emitting member, said conductors being disposed in said recess and having said outer ends thereof projecting through the open bottom of said recess, said cover having fixtures for retaining said conductors in said recess, and indicating means on said body for indicating the direction in which said body should be placed relative to said tooth-brush for testing said battery of said tooth-brush; whereby when said outer ends of said conductors touch said electrically conductive member and said exposed portion of said bar, the emission of light by said light emitting member is determined by the condition of the battery, said indicating means being provided on said cover and comprising a representation of an arrow and either a picture of the tooth-brush or characters identifying a part of the tooth-brush.

* * * * *